(12) United States Patent
Michikoshi

(10) Patent No.: US 11,094,615 B2
(45) Date of Patent: Aug. 17, 2021

(54) SEMICONDUCTOR APPARATUS INCLUDING LEADS AND BONDING WIRES

(71) Applicant: SUMITOMO ELECTRIC INDUSTRIES, LTD., Osaka (JP)

(72) Inventor: Hisato Michikoshi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/764,971

(22) PCT Filed: Sep. 13, 2018

(86) PCT No.: PCT/JP2018/034048
§ 371 (c)(1),
(2) Date: May 18, 2020

(87) PCT Pub. No.: WO2019/102694
PCT Pub. Date: May 31, 2019

(65) Prior Publication Data
US 2020/0350235 A1    Nov. 5, 2020

(30) Foreign Application Priority Data

Nov. 27, 2017   (JP) .............................. JP2017-226585

(51) Int. Cl.
*H01L 23/48*    (2006.01)
*H01L 23/00*    (2006.01)

(52) U.S. Cl.
CPC ............ *H01L 23/481* (2013.01); *H01L 24/06* (2013.01); *H01L 24/49* (2013.01)

(58) Field of Classification Search
CPC ....... H01L 23/481; H01L 24/06; H01L 24/49; H01L 23/49541; H01L 23/49562;
(Continued)

(56) References Cited

U.S. PATENT DOCUMENTS

2014/0264383 A1* 9/2014 Kajiwara ............ H01L 23/4952
257/77
2016/0093561 A1* 3/2016 Tabira ............... H01L 23/49541
257/676

(Continued)

FOREIGN PATENT DOCUMENTS

JP    2008-104348    5/2008
JP    2010-283252    12/2010
(Continued)

*Primary Examiner* — Didarul A Mazumder
(74) *Attorney, Agent, or Firm* — IPUSA, PLLC

(57) ABSTRACT

A semiconductor device, a drain electrode terminal supporting the semiconductor device and connected directly to a drain electrode pad, a source electrode terminal connected to a source electrode pad, and a gate electrode terminal are provided, wherein the source electrode terminal includes a wire post, a first lead extending from one end of the wire post, and a second lead extending from another end of the wire post, wherein the source electrode pad and the wire post of the source electrode terminal are connected to each other through a plurality of bonding wires, and wherein the semiconductor device, a surface, supporting the semiconductor device thereon, of the drain electrode terminal, the wire post of the source electrode terminal, the bonding wires, and part of the gate electrode terminal are covered with a mold resin.

19 Claims, 11 Drawing Sheets

(58) Field of Classification Search
CPC . H01L 23/49555; H01L 23/544; H01L 24/97; H01L 23/04
USPC ........ 257/774; 438/629, 637, 639, 640, 667, 438/668, 672, 675, 700, 701, 713, 978
See application file for complete search history.

(56) References Cited

U.S. PATENT DOCUMENTS

2016/0294379 A1 10/2016 Hayashiguchi et al.
2017/0213782 A1 7/2017 Iwai

FOREIGN PATENT DOCUMENTS

JP 2017-135241 8/2017
WO 2015/076257 5/2015

* cited by examiner

US 11,094,615 B2

SEMICONDUCTOR APPARATUS INCLUDING LEADS AND BONDING WIRES

TECHNICAL FIELD

The disclosures herein relate to a semiconductor apparatus.

The present application claims priority to Japanese patent application No. 2017-226585 filed on Nov. 27, 2017, and the entire contents of the Japanese patent application are hereby incorporated by reference.

BACKGROUND ART

A semiconductor device such as a MOSFET (metal-oxide-semiconductor field-effect transistor) is normally encapsulated in a mold resin or the like such that the semiconductor chip and electrode terminals are connected to each other. Various configurations are conceived with respect to a type of a semiconductor device that withstands high voltage and is capable of conducting a large current.

RELATED-ART DOCUMENTS

Patent Document

[Patent Document 1] International Publication Pamphlet No. WO2015/076257

SUMMARY OF THE INVENTION

According to one aspect of the present embodiment, a semiconductor apparatus includes a semiconductor device having a drain electrode pad formed on a first surface thereof, and having a source electrode pad and a gate electrode pad formed on a second surface thereof opposite the first surface, a drain electrode terminal supporting the semiconductor device at the first surface, and connected directly to the drain electrode pad, a source electrode terminal connected to the source electrode pad of the semiconductor device, and a gate electrode terminal connected to the gate electrode pad of the semiconductor device. The source electrode terminal includes a wire post, a first lead extending from one end of the wire post, and a second lead extending from another end of the wire post. The source electrode pad of the semiconductor device and the wire post of the source electrode terminal are connected to each other through a plurality of bonding wires, and the semiconductor device, a surface, supporting the semiconductor device thereon, of the drain electrode terminal, the wire post of the source electrode terminal, the bonding wires, and part of the gate electrode terminal are covered with a mold resin.

MODE FOR CARRYING OUT THE INVENTION

Figure 1:
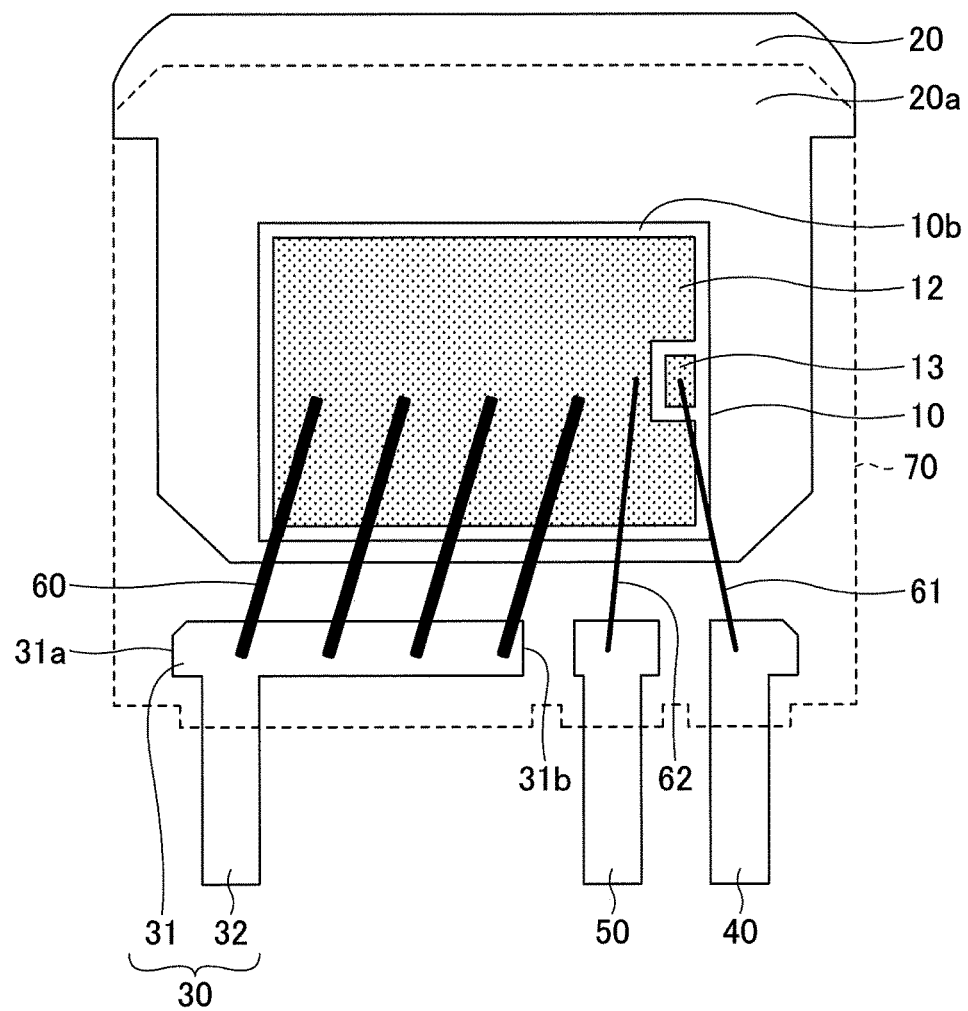
FIG. 1 is an illustrative drawing of a semiconductor apparatus.

In the semiconductor apparatus as described above, bumps of a semiconductor chip made of Si or SiC and electrode terminals implemented as a lead frame or the like are electrically coupled through bonding wires. Since the lead frame is plate shaped, provision of a plurality of bonding wires may make it difficult for high-strength bonding wires to be reliably and stably made. Such a case results in a reduced reliability of the semiconductor device, and is thus not desirable. Accordingly, the purpose of the present disclosures is to provide a reliable semiconductor apparatus that withstands high voltage and that is capable of conducting a large current.

According to the present disclosures, a reliable semiconductor apparatus is provided that withstands high voltage and that is capable of conducting a large current.

Embodiments will be described in the following.

DESCRIPTION OF EMBODIMENTS OF THE PRESENT DISCLOSURES

Embodiments of the present disclosures will be listed and described first. In the following description, the same or corresponding elements are referred to by the same reference numerals, and a duplicate description thereof will be omitted.

[1] A semiconductor apparatus according to an embodiment of the present disclosures includes a semiconductor device having a drain electrode pad formed on a first surface thereof, and having a source electrode pad and a gate electrode pad formed on a second surface thereof opposite the first surface, a drain electrode terminal supporting the semiconductor device at the first surface, and connected directly to the drain electrode pad, a source electrode terminal connected to the source electrode pad of the semiconductor device, and a gate electrode terminal connected to the gate electrode pad of the semiconductor device, wherein the source electrode terminal includes a wire post, a first lead extending from one end of the wire post, and a second lead extending from another end of the wire post, wherein the source electrode pad of the semiconductor device and the wire post of the source electrode terminal are connected to each other through a plurality of bonding wires, and wherein the semiconductor device, a surface, supporting the semiconductor device thereon, of the drain electrode terminal, the wire post of the source electrode terminal, the bonding wires, and part of the gate electrode terminal are covered with a mold resin.

The inventor of the present application has conducted study with respect to a semiconductor apparatus that withstands high voltage and that is capable of conducting a large current. It has then been found that a semiconductor device withstanding high voltage and capable of conducting a large current may be obtainable, but a semiconductor apparatus made by packaging such a device may have factors that limit currents. Specifically, while the drain electrode pad of the semiconductor device is directly connected to the drain electrode terminal, the source electrode pad is connected to the source electrode terminal through bonding wires. These bonding wires have a limit on the amount of current that can flow therethrough. It has thus been found that the amount of current that the semiconductor apparatus can conduct is also limited by the bonding wires. In order to avoid this, the number of bonding wires may be increased, in which case, however, the wire post connected to the bonding wires at the source electrode terminal needs to be increased in size. Because of this, when connections are made through the bonding wires while the source electrode terminal is supported by a single lead, the portion of the wire post away from the lead may easily move, which may make the connections of bonding wires unstable, and may readily cause disconnection or the like. In consideration of this, the inventor of the present application has come to make a structure that can support the wire post in a stable manner for connection to bonding wires by providing a first lead and a second lead to the source electrode terminal so that the wire post can be supported at or around both ends thereof. Such a structure allows connections between the bonding wires and the wire post of the source electrode terminal to be securely made, and also allows the strength of bonding wires to be increased, thereby improving the reliability of the semiconductor apparatus.

The above-described problem has surfaced for the first time only after the progress of semiconductor devices allowed the conduction of a large current. Such a problem never existed when no semiconductor devices were capable of conducting a large current.

[2] The drain electrode terminal is disposed on a different side from where the source electrode terminal and the gate electrode terminal are disposed.

[3] The drain electrode terminal is disposed on the opposite side from where the source electrode terminal and the gate electrode terminal are disposed.

[4] The wire post has no holes.

[5] A source sense terminal connected to the source electrode pad of the semiconductor device is provided.

[6] The length L of the wire post of the source electrode terminal in the longitudinal direction thereof and the width W of the semiconductor device in the noted longitudinal direction are such that $40\% \leq L/W \leq 90\%$.

[7] The number of bonding wires connecting the source electrode pad of the semiconductor device and the wire post of the source electrode terminal is greater than or equal to 5 and less than or equal to 20.

[8] A protrusion is provided on the lateral face of the drain electrode terminal to extend from the lateral face of the drain electrode terminal, and the protrusion is situated on the same side of the lateral face of the drain electrode terminal as the surface, supporting the semiconductor device thereon, of the drain electrode terminal.

[9] A protrusion is provided on the lateral face of the wire post to extend from the lateral face of the wire post, and the protrusion is situated on the opposite side of the lateral face from the surface connected to the bonding wires.

[10] The semiconductor device is made of a material containing SiC.

[11] There are a semiconductor device having a drain electrode pad formed on a first surface thereof, and having a source electrode pad and a gate electrode pad formed on a second surface thereof opposite the first surface, a drain electrode terminal supporting the semiconductor device at the first surface, and connected directly to the drain electrode pad, a source electrode terminal connected to the source electrode pad of the semiconductor device, and a gate electrode terminal connected to the gate electrode pad of the semiconductor device, wherein the source electrode terminal includes a wire post, a first lead extending from one end of the wire post, and a second lead extending from another end of the wire post, wherein the source electrode pad of the semiconductor device and the wire post of the source electrode terminal are connected to each other through a plurality of bonding wires, wherein the semiconductor device, a surface, supporting the semiconductor device thereon, of the drain electrode terminal, the wire post of the source electrode terminal, the bonding wires, and part of the gate electrode terminal are covered with a mold resin, wherein the drain electrode terminal is disposed on the opposite side from where the source electrode terminal and the gate electrode terminal are disposed, wherein the wire post has no holes, wherein a source sense terminal connected to the source electrode pad of the semiconductor device is provided, wherein the length L of the wire post of the source electrode terminal in the longitudinal direction thereof and the width W of the semiconductor device in the noted longitudinal direction are such that $40\% \leq L/W \leq 90\%$, and wherein the number of bonding wires connecting the source electrode pad of the semiconductor device and the wire post of the source electrode terminal is greater than or equal to 5 and less than or equal to 20.

[12] There are a semiconductor device having a drain electrode pad formed on a first surface thereof, and having a source electrode pad and a gate electrode pad formed on a second surface thereof opposite the first surface, a drain electrode terminal supporting the semiconductor device at the first surface, and connected directly to the drain electrode pad, a source electrode terminal connected to the source electrode pad of the semiconductor device, and a gate electrode terminal connected to the gate electrode pad of the semiconductor device, wherein the source electrode terminal includes a wire post, a first lead extending from one end of the wire post, and a second lead extending from another end of the wire post, wherein the source electrode pad of the semiconductor device and the wire post of the source electrode terminal are connected to each other through a plurality of bonding wires, wherein the semiconductor device, a surface, supporting the semiconductor device thereon, of the drain electrode terminal, the wire post of the source electrode terminal, the bonding wires, and part of the gate electrode terminal are covered with a mold resin, wherein the drain electrode terminal is disposed on the opposite side from where the source electrode terminal and the gate electrode terminal are disposed, wherein a protrusion is provided on the lateral face of the drain electrode terminal to extend from the lateral face of the drain electrode terminal, wherein the protrusion is situated on the same side of the lateral face of the drain electrode terminal as the surface, supporting the semiconductor device thereon, of the drain electrode terminal, wherein a protrusion is provided on the lateral face of the wire post to extend from the lateral face of the wire post, and wherein the protrusion is situated on the opposite side of the lateral face from the surface connected to the bonding wires.

Details of Embodiments of the Present Disclosures

In the following, an embodiment (hereinafter referred to as a present embodiment) of the present disclosures will be described in detail, with a caveat that the present embodiment is not limited to those described.

Figure 2:
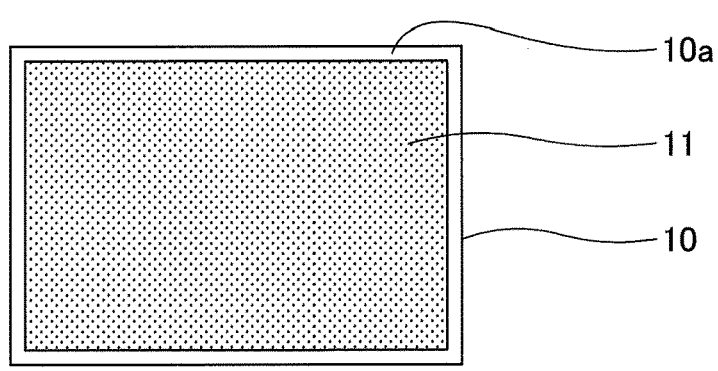
FIG. 2 is a plan view of a first surface of the semiconductor device.

A semiconductor apparatus that withstands high voltage and that is capable of conducting a large current will be described first with reference to FIG. 1. The semiconductor apparatus includes a semiconductor chip 10 serving as a semiconductor device, and includes a drain electrode terminal 20, a source electrode terminal 30, a gate electrode terminal 40, a source sense terminal 50, and the like, which are implemented as a lead frame. The semiconductor chip 10 has a drain electrode pad 11 formed on a first surface 10a as illustrated in FIG. 2, and has a source electrode pad 12 and a gate electrode pad 13 formed on a second surface 10b opposite the first surface 10a as illustrated in FIG. 1. The first surface 10a, on which the drain electrode pad 11 of the semiconductor chip 10 is formed, is directly connected to a first surface 20a of the planar drain electrode terminal 20 with a solder or the like. The source electrode pad 12 formed on the second surface 10b of the semiconductor chip 10 and the source electrode terminal 30 are connected through four bonding wires 60. The gate electrode pad 13 and the gate electrode terminal 40 are connected to each other through a bonding wire 60. Further, the source electrode pad 12 and the source sense terminal 50 are connected to each other through a bonding wire 62.

It may be noted that, in the semiconductor apparatus illustrated in FIG. 1, the semiconductor chip 10, the bonding wires 60, 61, and 62, the wire post 31 of the source electrode terminal 30, and part of the drain electrode terminal 20, the gate electrode terminal 40, and the source sense terminal 50 are covered with a mold resin 70. In FIG. 1, the mold resin 70 is illustrated in dashed lines for the sake of convenience.

The gate electrode pad 13 receives a gate voltage, but conducts almost no current, so that it suffices for the bonding wire 61 to be thin. Also, the source sense terminal 50 conducts almost no current, and is provided to obtain the potential of the source electrode pad 12 in a stable manner so as to allow a desired voltage to be applied to the gate electrode pad 13 with reference to the source electrode pad 12. The bond wire 62 may thus also be thin.

Electrical resistance between the drain electrode pad 11 provided on the first surface 10a of the semiconductor chip 10 and the first surface 20a of the drain electrode terminal 20 is extremely low because substantially the entire surface of the drain electrode pad 11 on the first surface 10a of the semiconductor chip 10 is bonded to the first surface 20a of the drain electrode terminal 20 with a solder or the like. Further, the source electrode pad 12 provided on the second surface of the semiconductor chip 10 and the source electrode terminal 30 are electrically connected through the four bonding wires 60, so that a relatively large current can be conducted therebetween.

It may be noted that an increase in the diameter of the bonding wires 60 results in an increase in the amount of conducting current. For example, the bonding wire 60 is considered to conduct a current of 10 A in the case of the diameter being 200 µm, to conduct a current of 20 A in the case of the diameter being 300 µm, and to conduct a current of 30 A in the case of the diameter being 400 µm. Flow of a current that is significantly in excess of the amount tolerable to the bonding wire 60 may cause a break in the wire due to heat generation or the like, so that a limit is placed on the amount of current allowed to flow through each bonding wire 60. Due to this reason, the four bonding wires 60 are used in the semiconductor apparatus illustrated in FIG. 1 to connect the source electrode pad 12 provided on the second surface of the semiconductor chip 10 and the source electrode terminal 30, such that a desired mount of current can be conducted.

To this end, the source electrode terminal 30 in the semiconductor apparatus illustrated in FIG. 1 has the wire post 31 that allows connection with a plurality of bonding wires 60, and has a lead 32 extending from around one end 31a of the length of the wire post 31. In order to connect the source electrode pad 12 of the semiconductor chip 10 to the source electrode terminal 30 through the bonding wires 60, the source electrode terminal 30 is initially placed in such a position that the longitudinal direction of the wire post 31 is substantially parallel to one side of the semiconductor chip 10. While a portion of the lead 32 of the source electrode terminal 30 is securely held by a hold member or the like, the bonding wires 60 are provided to connect the source electrode pad 12 of the semiconductor chip 10 and the source electrode terminal 30.

In a semiconductor apparatus capable of conducting a large current, wire bonding is performed by a wedge bonding, for example. Aluminum (Al) is used as the material for the bonding wire 60. In order to connect a bonding wire to an electrode pad or the like, the tip of the bonding wire is securely held down while applying heat, a force, and ultrasonic waves to the bonding wire.

Connecting the bonding wires 60 to the source electrode terminal 30 supported by the single lead 32 may cause ultrasonic vibration used for connecting the bonding wires 60 to be transmitted to, and cause vibration at, the wire post 31 of the source electrode terminal 30. Since the source electrode terminal 30 is made of a metallic material and thus elastic, vibration and the like are particularly noticeable around the other end 31b of the wire post 31 away from the supported lead 32. When the wire post 31 moves due to ultrasonic vibration at the time of connecting the bonding wires 60 as described above, reliable and stable connections cannot be made. Further, insufficient strength results in an increased risk of the bonding wires 60 being disconnected. This reduces the reliability of the semiconductor apparatus.

It may be noted that, in a semiconductor apparatus capable of withstanding high voltage and conducting a large current, a thick bonding wire 60 having a large diameter may be used, and the number of such bonding wires may be increased, so as to allow the conduction of a large current. Electrical resistance between the drain electrode pad 11 of the semiconductor chip 10 and the first surface 20a of the drain electrode terminal 20 is extremely low because substantially the entire surface of the drain electrode pad 11 on the first surface 10a of the semiconductor chip 10 is bonded to the first surface 20a of the drain electrode terminal 20 with a solder or the like, which allows the conduction of a large current. In consideration of this, thick bonding wires 60 are used to connect the source electrode pad 12 provided on the second surface of the semiconductor chip 10 to the source electrode terminal 30, and the number of such bonding wires 60 is increased to achieve the conduction of a large current through the semiconductor chip 10.

However, an increase in the number of bonding wires 60 causes the bonding wires 60 to become unstable and to have an increased risk of disconnection due to the vibration occurring at the time of connecting the bonding wires as described above. This reduces the reliability of the semiconductor apparatus. The longer the wire post 31 in the longitudinal direction is, the more noticeable the above-noted problem is. For example, the problem becomes increasingly noticeable as the length of the wire post 31 in the longitudinal direction is increased for the purpose of securing the area for connecting the bonding wires 60 in response to an increase in the number of bonding wires 60.

The purpose of conducting a large current may be achieved by a method of providing a large number of bonding wires having a small diameter. In this case, however, the number of bonding wires ends up being increased to provide the same amount of current. For example, when there is a need to use bonding wires having a diameter of 200 μm to provide the same amount of current as the current provided by 4 bonding wires having a diameter of 400 μm, three times as many bonding wires having a diameter of 200 μm, i.e., 12 bonding wires, are required. Such an increase in the number of bonding wires causes the size of the wire post connected to the bonding wires to be increased and to cause the time required for making wire bonding connections to be increased, which results in increases in the size and cost of the semiconductor apparatus. Further, vibration occurring at the time of making wire bonding connections increases the number of bonding wires 60 that are not stable and at an increased risk of disconnection, resulting in a reduced reliability of the semiconductor apparatus.

In addition to the above-noted capacity of conducting a large current, a semiconductor apparatus capable of withstanding high voltage and conducting a large current is also required to have good heat dissipation and compact size.
(Semiconductor Device)

Figure 3:
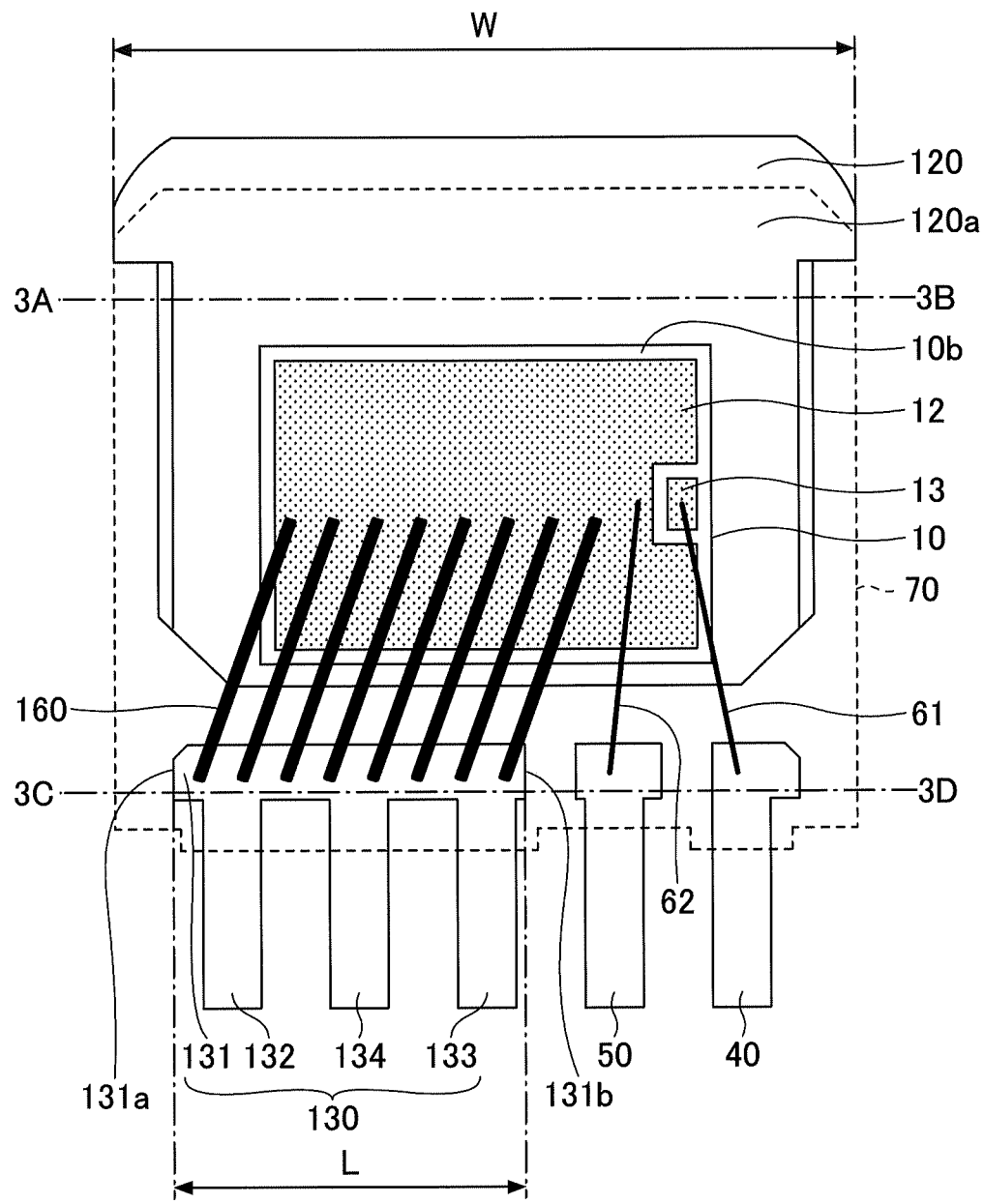
FIG. 3 is an illustrative drawing of the semiconductor apparatus according to a first embodiment of the present disclosures.
Figure 4:
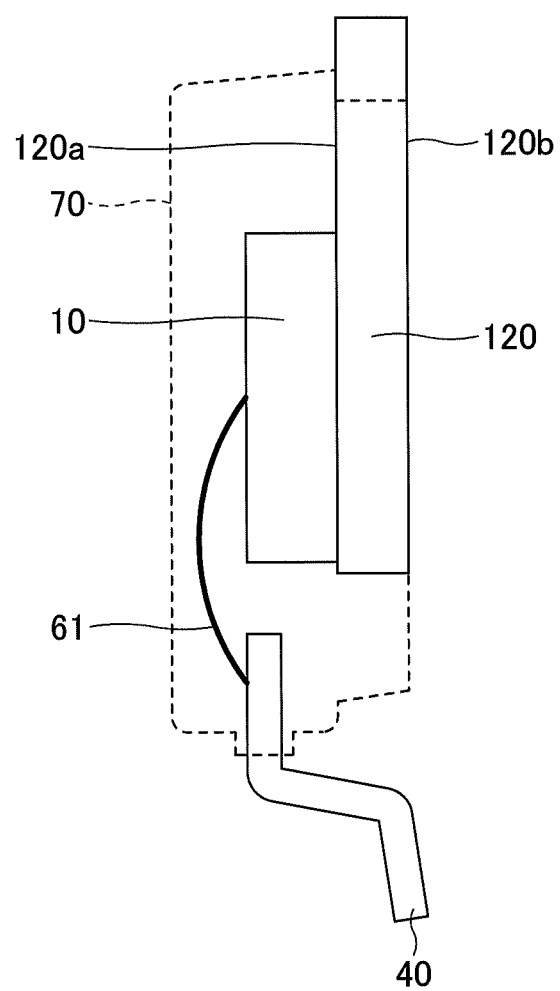
FIG. 4 is a side-elevation view of the semiconductor apparatus according to the first embodiment of the present disclosures.
Figure 5:
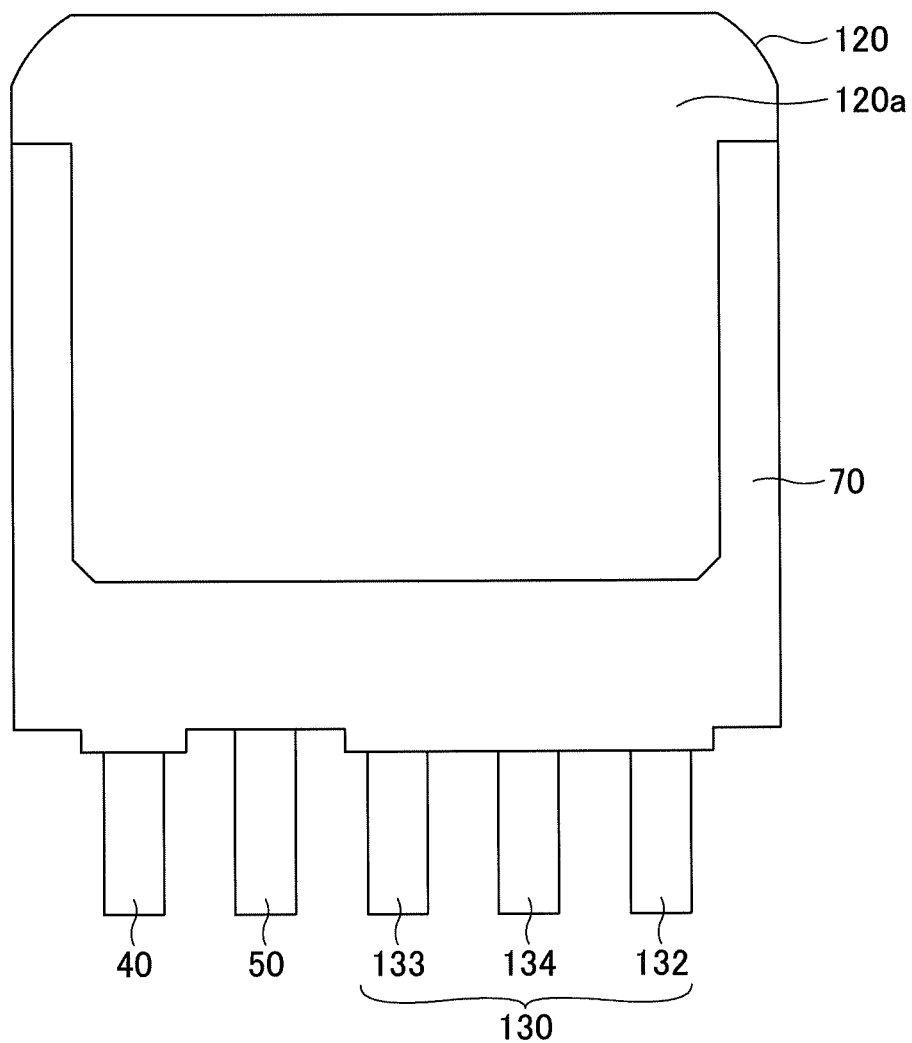
FIG. 5 is a bottom view of the semiconductor apparatus according to the first embodiment of the present disclosures.

In the following, a semiconductor apparatus according to a present embodiment will be described with reference to FIG. 2 through FIG. 5. The semiconductor apparatus of the present embodiment employs a structure which has leads extending from the respective longitudinal ends of a wire post of the source electrode terminal for the purpose of improving reliability. In this arrangement, thus, the source electrode terminal is provided with a plurality of leads. FIG. 3 is a top view of the semiconductor apparatus according to the present embodiment. FIG. 4 is a side-elevation view. FIG. 5 is a bottom view.

The semiconductor apparatus of the present embodiment includes a semiconductor chip 10 serving as a semiconductor device, a drain electrode terminal 120 implemented as a lead frame, a source electrode terminal 130, a gate electrode terminal 40, a source sense terminal 50, and the like. The semiconductor chip 10 is made of Si or SiC. In order to meet the demands for high voltage and large current, the semiconductor chip 10 is preferably made of SiC with a wide band gap.

The semiconductor chip 10 has a drain electrode pad 11 formed on the first surface 10a, and has a source electrode pad 12 and a gate electrode pad 13 formed on the second surface 10b. The first surface 10a, on which the drain electrode pad 11 of the semiconductor chip 10 is formed, is directly connected to a first surface 120a of the planar drain electrode terminal 120 with a solder or the like. The source electrode pad 12 formed on the second surface 10b of the semiconductor chip 10 and the source electrode terminal 130 are connected through eight bonding wires 160 so as to allow the conduction of a large current. The gate electrode pad 13 and the gate electrode terminal 40 are connected to each other through a bonding wire 61. The source electrode pad 12 and the source sense terminal 50 are connected to each other through a bonding wire 62. Accordingly, the drain electrode terminal 120 is disposed on the opposite side from where the source electrode terminal 130 and the gate electrode terminal 40 are disposed. It may be noted that the semiconductor chip 10, the bonding wires 160, 61, and 62, the area, having the wire post 131 formed therein, of the source electrode terminal 130, and part of the drain electrode terminal 120, the gate electrode terminal 40, and the source sense terminal 50 are covered with a mold resin 70. In FIG. 3 and FIG. 4, the mold resin is illustrated in dashed lines for the sake of convenience.

The gate electrode pad 13 receives a gate voltage, but conducts almost no current, so that it suffices for the bonding wire 61 to be thin. The source sense terminal 50, which is provided to obtain the potential of the source electrode pad 12 in a stable manner so as to allow a desired voltage to be applied to the gate electrode pad 13 with reference to the source electrode pad 12, conducts almost no current, so that it suffices for the bonding wire 62 to be thin. The semiconductor apparatus according to the present embodiment has eight bonding wires 160 that can conduct twice the current of the four bonding wires 60 used in the semiconductor apparatus illustrated in FIG. 1.

The source electrode terminal 130 of the present embodiment has the wire post 131 that allows connection with a plurality of bonding wires 160. A first lead 132 extends from around one end 131a of the length of the wire post 131, and a second lead 133 extends from around the other end 131b. A third lead 134 extends from a portion between the first lead 132 and the second lead 133. It may be noted that the wire post 131 has no through-holes.

In order to connect the source electrode pad 12 of the semiconductor chip 10 to the source electrode terminal 130 through the bonding wires 160, the source electrode terminal 130 is initially placed in such a position that the longitudinal direction of the wire post 131 is substantially parallel to one side of the semiconductor chip 10. In this state, a portion of the first lead 132 of the source electrode terminal 130, a portion of the second lead 133, and a portion of the third lead 134 are securely held by a hold member or the like. While in this state in the present embodiment, the bonding wires 160 are provided to connect the source electrode pad 12 of the semiconductor chip 10 and the source electrode terminal 130.

Due to the fact that a portion of the first lead 132, a portion of the second lead 133, and a portion of the third lead 134 are securely held, the vibration of the wire post 131 of the source electrode terminal 130 is reduced despite the occurrence of vibration caused by ultrasound at the time of connecting the bonding wires 160. As described above, one end 131a of the wire post 131 is supported by the first lead 132, and the other end 131b of the wire post 131 is supported by the second lead 133. Vibration occurring around the other end 31b of the wire post 131 is thus extremely small at the time of connecting the bonding wires 160. With this arrangement, connections by the bonding wires 160 are stably and securely made, and the strength of the connections provided by the bonding wires 160 is increased to reduce the risk of disconnection, which improves the reliability of the semiconductor apparatus. Further, in the present embodiment, the wire post 131 of the source electrode terminal 130 is supported by the third lead 134, which further reduces vibration at the time of making wire bonding connections.

In the present embodiment, the number of bonding wires 160 is greater than or equal to 5 and less than or equal to 20. For the purpose of achieving the conduction of a large current, the larger the number of bonding wires 160 is, the more preferable the configuration is. However, an increase in the number of bonding wires 160 requires the size of the wire post 131 of the source electrode terminal 130 to be increased for the purpose of connecting the bonding wires 160. This results in an increase in the size of the semiconductor apparatus, and also causes an increase in the time required to manufacture the semiconductor apparatus, thereby resulting in an cost increase. In the present embodiment, the number of bonding wires 160 is 8, 12, or the like, for example.

(Source Electrode Terminal)

Figure 6:
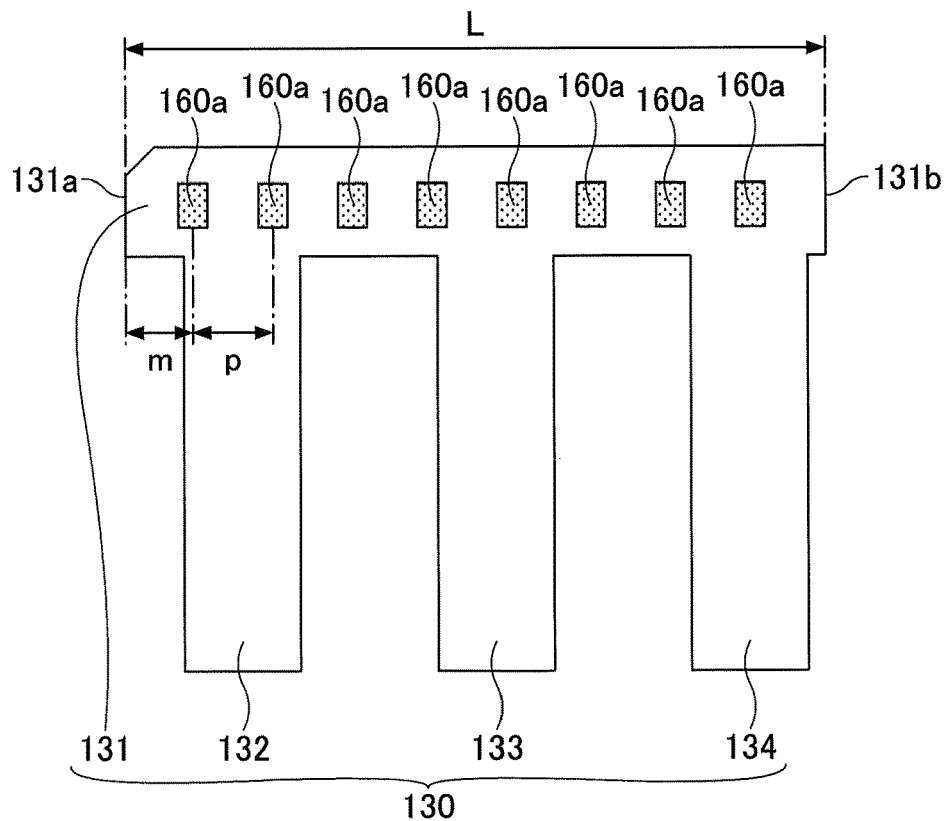
FIG. 6 is an illustrative drawing of a source electrode terminal of the semiconductor apparatus according to the first embodiment of the present disclosures.

In the following, the length of the wire post 131 of the source electrode terminal 130 in the longitudinal direction in the semiconductor apparatus of the present embodiment will be described with reference to FIG. 6. As was previously described, a semiconductor apparatus capable of withstanding high voltage and conducting a large current is also required to be reduced in size. In consideration of this, it is preferable to avoid an increase in the size of a semiconductor apparatus even when the number of bonding wires 160 is increased. The length of the wire post 131 in the longitudinal direction is thus preferably not too long. In the semiconductor apparatus according to the present embodiment, it is preferable that the length L (mm) of the wire post 131 of the source electrode terminal 130 in the longitudinal direction thereof satisfies the relationship (1) shown below when the number of bonding wires 160 is denoted as "n". Namely, it is preferable that the length L (mm) from one end 131a of the wire post 131 of the source electrode terminal 130 to the other end 131b satisfies the relationship (1) shown below when the number of bonding wires 160 is denoted as "n".

It may be noted that p is the pitch between the centers of the connection regions 160a of the bonding wires 160, and m is the length from the center of the connection region 160a of the bonding wire 160 at either end to the corresponding one of the longitudinal ends of the wire post 131. Upon conducting analysis, it was found that p is preferably 0.8 mm, and m is preferably 0.6 mm. Based on this finding, the relationship (1) is rewritten as the relationship (2).

$$L \leq p \times n + 2 \times m \quad (1)$$

$$L \leq 0.8 \text{ mm} \times n + 2 \times 0.6 \text{ mm} = 0.8 \text{ mm} \times n + 1.2 \text{ mm} \quad (2)$$

In the semiconductor apparatus according to the embodiment, the width of the semiconductor device in the longitudinal direction of the wire post 131 may be denoted as W as illustrated in FIG. 3. In such a case, the relationship as follows is satisfied.

$$40\% \leq L/W \leq 90\%$$

This is because the use of a value of L/W that is less than 40% results in an insufficient number of bonding wires 160 being connected to the wire post 131, and the use of a value of L/W that exceeds 90% results in a failure to provide space for the source sense terminal 50 and the like. The noted arrangement allows the length L of the wire post 131 to be increased, and allows a sufficient number of bonding wires 160 to be connected, without excessively increasing the size of the semiconductor apparatus.

(Drain Electrode Terminal)

In the following, the drain electrode terminal 120 of the semiconductor apparatus according to the present embodiment will be described with reference to FIG. 7 and FIG. 8.

Figure 7:
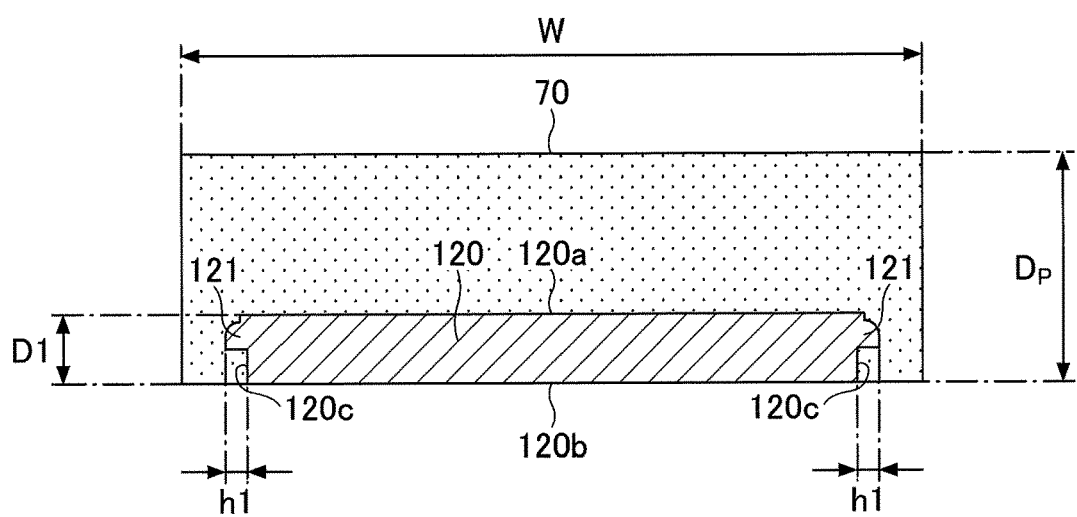
FIG. 7 is a cross-sectional view (1) of the semiconductor apparatus according to the first embodiment of the present disclosures.
Figure 8:
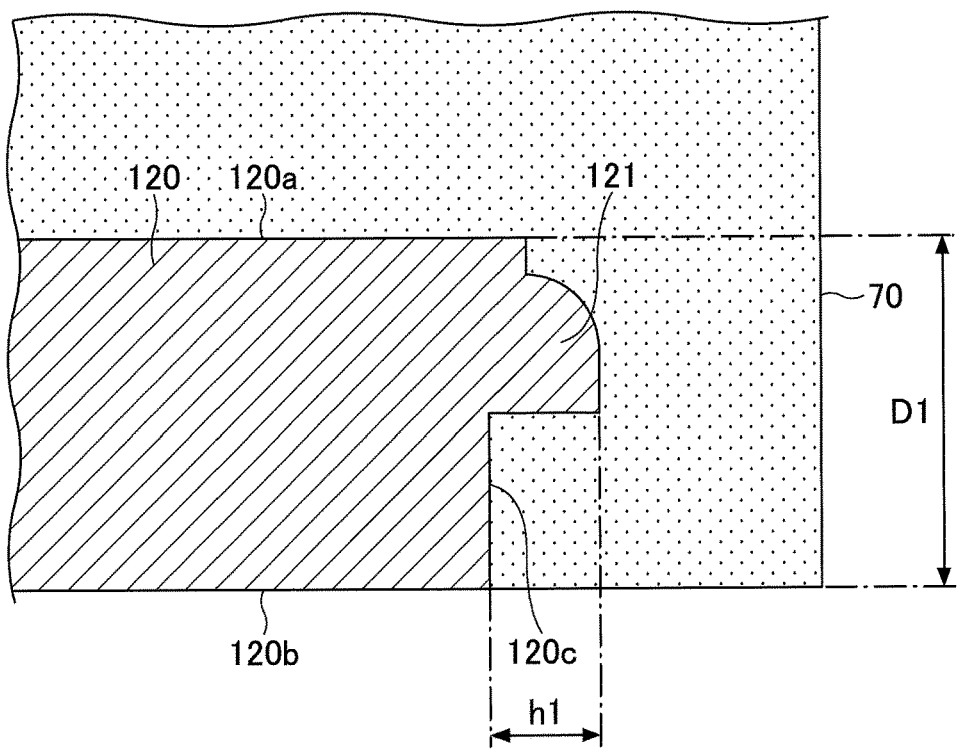
FIG. 8 is an enlarged view of a main portion of FIG. 7.

FIG. 7 is a cross-sectional view taken along the dot-and-dash line 3A-3B in FIG. 3. FIG. 8 is an enlarged view of a main part of FIG. 7.

In the semiconductor apparatus of the present embodiment, the semiconductor chip and part of the drain electrode terminal and the like are covered with the mold resin 70. Since the metallic material forming the drain electrode terminal and the like and the resin material forming the mold resin have different linear expansion coefficients, heat generated by the current flowing through the semiconductor apparatus may cause the mold resin to be disconnected from the drain electrode terminal and the like due to a difference in thermal expansion. Because of this, some semiconductor apparatuses capable of withstanding high voltage and conducting a large current may be structured such that a large hole is made in the center of the drain electrode terminal, which allows the mold resin to be also disposed in the hole and hardened, thereby reducing the risk of disconnection between the mold resin and the drain electrode terminal. Since the drain electrode terminal also functions as a heat-sink, the provision of a large hole in the center of the drain electrode terminal is not desirable because of the possibility of failing to provide sufficient heat dissipation.

In the semiconductor apparatus of the present embodiment, as illustrated in FIG. 7, a protrusion 121 is provided on each of the opposite lateral faces 120c of the drain electrode terminal 120 to extend outwardly. This protrusion 121 is provided on the same side of the lateral face 120c of the drain electrode terminal 120 as the first surface 120a, and extends outwardly from the lateral face 120c for a length of h1. The mold resin 70 covers the first surface 120a, supporting the semiconductor chip 10 thereon, of the drain electrode terminal 120, the lateral faces 120c, and the protrusions 121. The second surface 120b opposite the first surface 120a is not covered with the mold resin 70.

In the case in which the linear expansion coefficient of the material forming the drain electrode terminal 120 is greater than the linear expansion coefficient of the material forming the mold resin 70, an increase in temperature causes the drain electrode terminal 120 to thermally expand more than the mold resin 70. In the present embodiment, the protrusion 121 is provided on each of the opposite lateral faces 120c of the drain electrode terminal 120 at the position which is covered with the mold resin 70. With the thermal expansion of the drain electrode terminal 120 being greater than that of the mold resin 70, thus, the mold resin 70 that extends toward the second surface 120b beyond the protrusions 121 stops the protrusions 121 upon the occurrence of thermal expansion. This arrangement reduces a risk of the drain electrode terminal 120 being disconnected from the mold resin 70.

The difference between the linear expansion coefficient of the resin material forming the mold resin 70 and the linear expansion coefficient of the metallic material forming the drain electrode terminal 120 and the like may be set to 15 ppm/K, for example. Further, the range of temperature changes upon heat generation in the semiconductor apparatus may be set to 250 K. In such a case, when the width W of the semiconductor device in the direction perpendicular to the longitudinal direction of the gate electrode terminal 40 and the like is 13.5 mm, the above-noted temperature changes bring about a difference of about 0.051 mm in thermal expansion between the mold resin 70 and the drain electrode terminal 120 and the like. In view of the processing accuracy or the like of the gate electrode terminal 40, the length h1 of the protrusion 121 may preferably be more than twice the above-noted value. Namely, the length h1 of the protrusion 121 is preferably greater than or equal to 0.1 mm. It may be noted that the thickness Dp of the semiconductor apparatus of the present embodiment is approximately 5 mm, and the thickness D1 of the drain electrode terminal 120 is approximately 1.5 mm.

Figure 9:
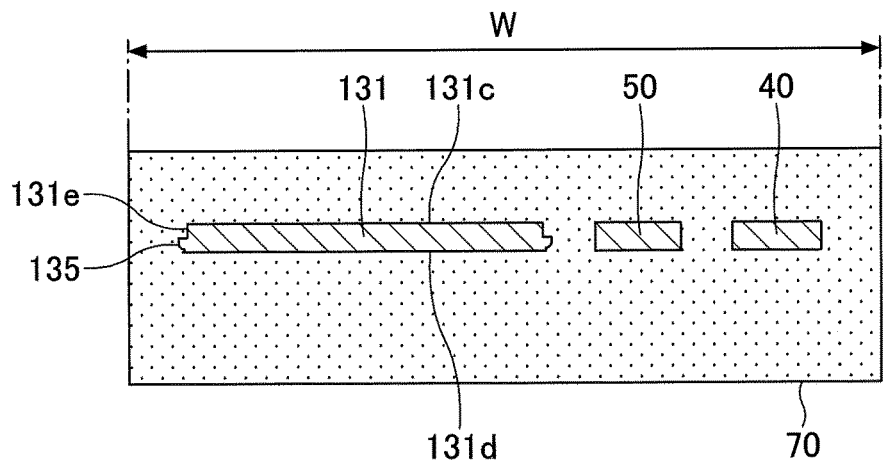
FIG. 9 is a cross-sectional view (2) of the semiconductor apparatus according to the first embodiment of the present disclosures.
Figure 10:
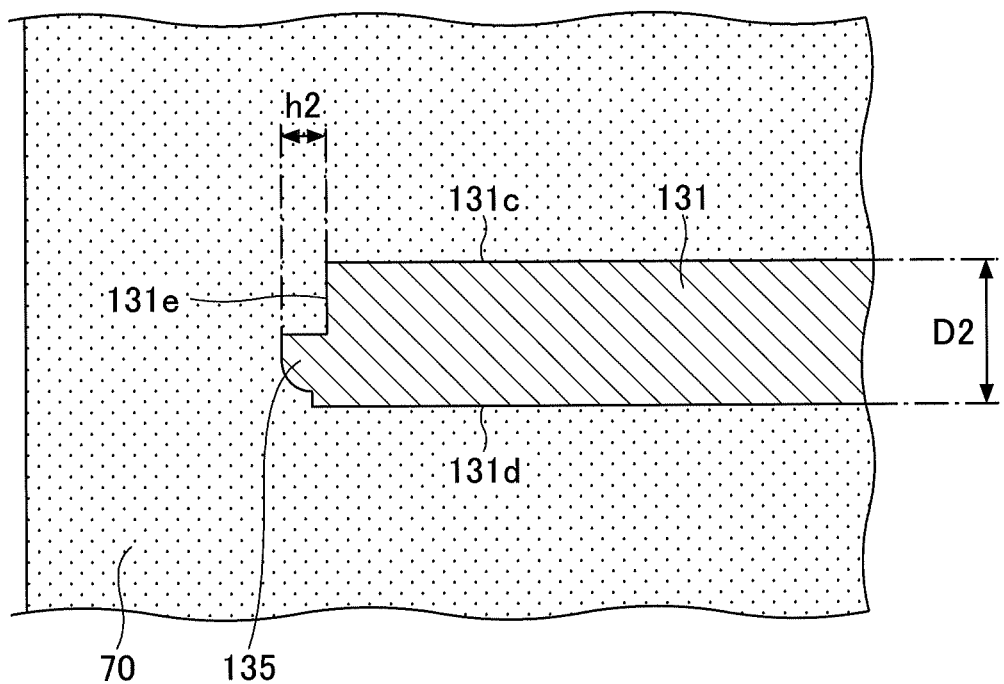
FIG. 10 is an enlarged view of a main portion of FIG. 9.

In the semiconductor apparatus of the present embodiment, as illustrated in FIG. 9 and FIG. 10, a protrusion 135 may also be provided on each of the lateral faces 131e of the wire post 131. FIG. 9 is a cross-sectional view taken along the dot-and-dash line 3C-3D in FIG. 3. FIG. 10 is an enlarged view of a main part of FIG. 9.

Namely, the semiconductor apparatus of the present embodiment is such that the protrusion 135 is provided on each of the lateral faces 131e of the wire post 131 to extend outwardly as illustrated in FIG. 9. This protrusion 135 is provided on the same side of the lateral face 131e of the wire post 131 as the second surface 131d, and extends outwardly from the lateral face 131e for a length of h2. The first surface 131c of the wire post 131 is connected to the bonding wires 160, and the second surface 131d is the opposite surface to the first surface 131c. The height h2 of the protrusion 135 of the wire post 131 is preferably greater than or equal to 0.1 mm. In the present embodiment, the height h2 is set to approximately 0.3 mm. The thickness D2 of the wire post 131 and the like is approximately 0.6 mm.

Figure 11:
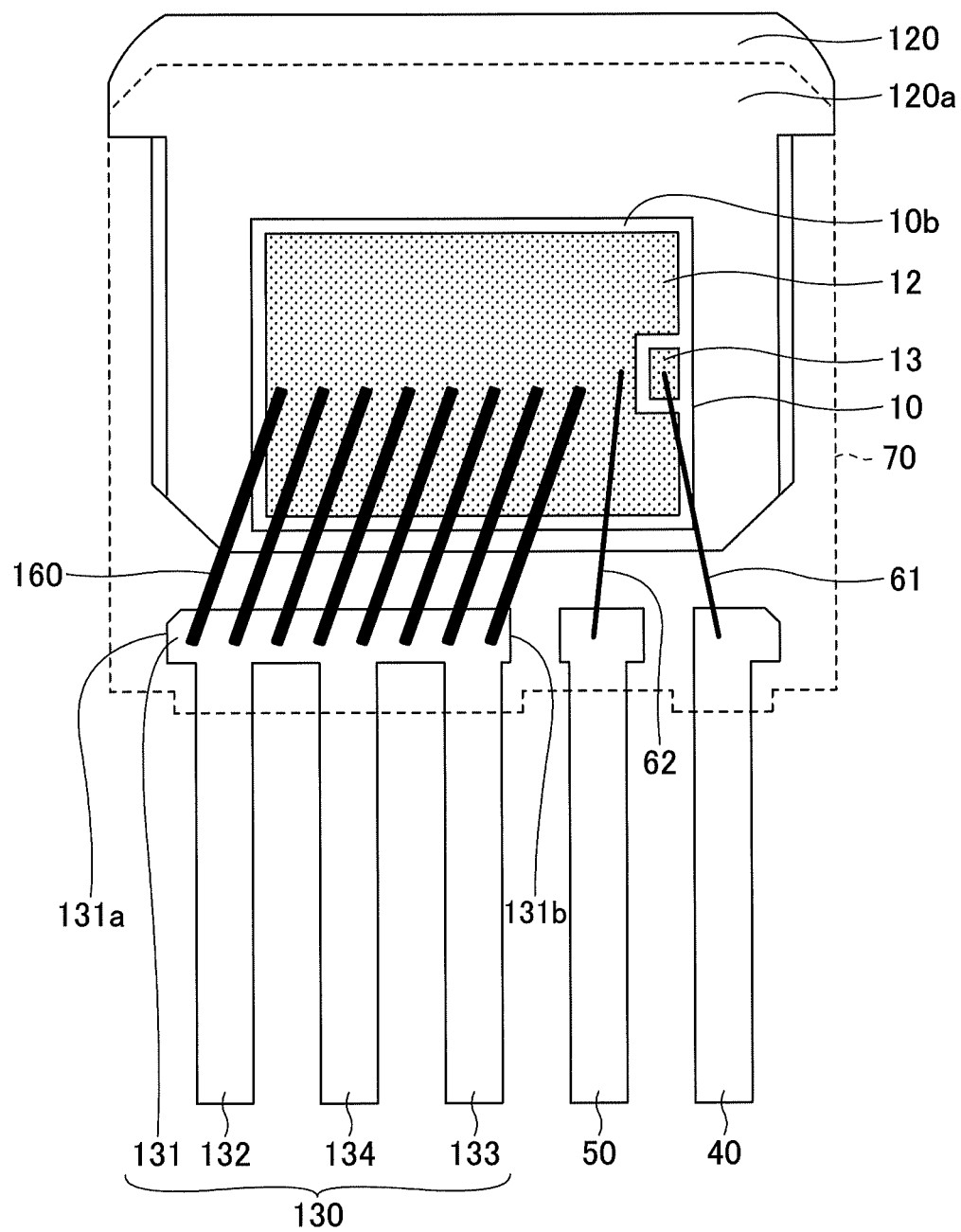
FIG. 11 is an illustrative drawing of a variation of the semiconductor apparatus according to the first embodiment of the present disclosures.
Figure 12:
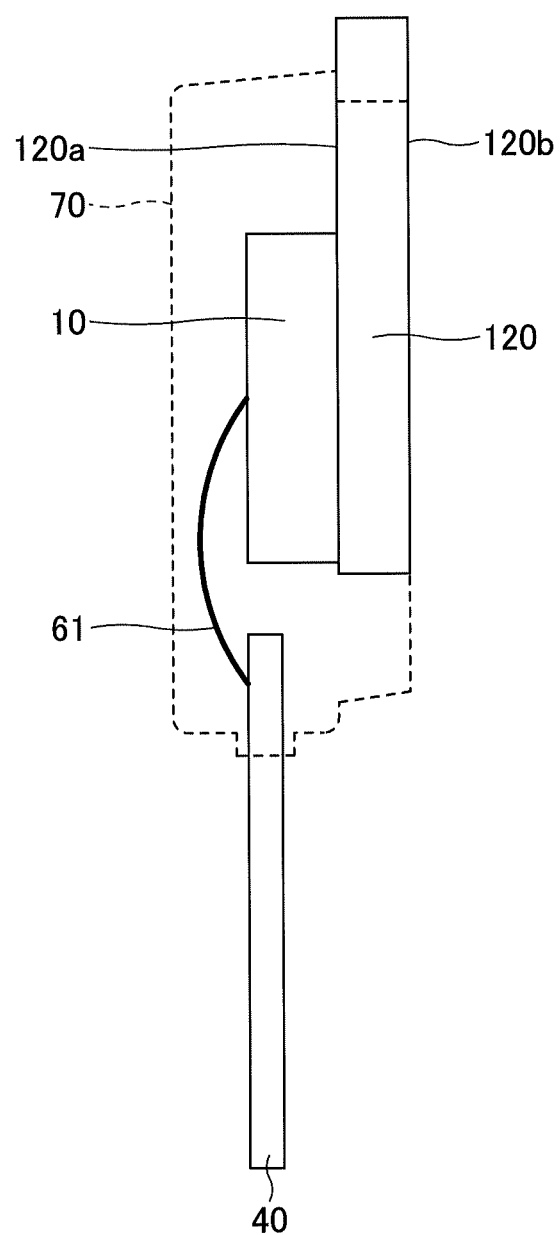
FIG. 12 is a side-elevation view of the variation of the semiconductor apparatus according to the first embodiment of the present disclosures.

It may be noted that the semiconductor apparatus described above has a structure in which the first lead 132 of the source electrode terminal 130, the second lead 133, the third lead 134, the gate electrode terminal 40, and the source sense terminal are bent at an intermediate point thereof. The semiconductor apparatus of the present embodiment may alternatively be configured such that, as illustrated in FIG. 11 and FIG. 12, the first lead 132 of the source electrode terminal 130, the second lead 133, the third lead 134, the gate electrode terminal 40, and the source sense terminal 50 extend straight.

Second Embodiment

Figure 13:
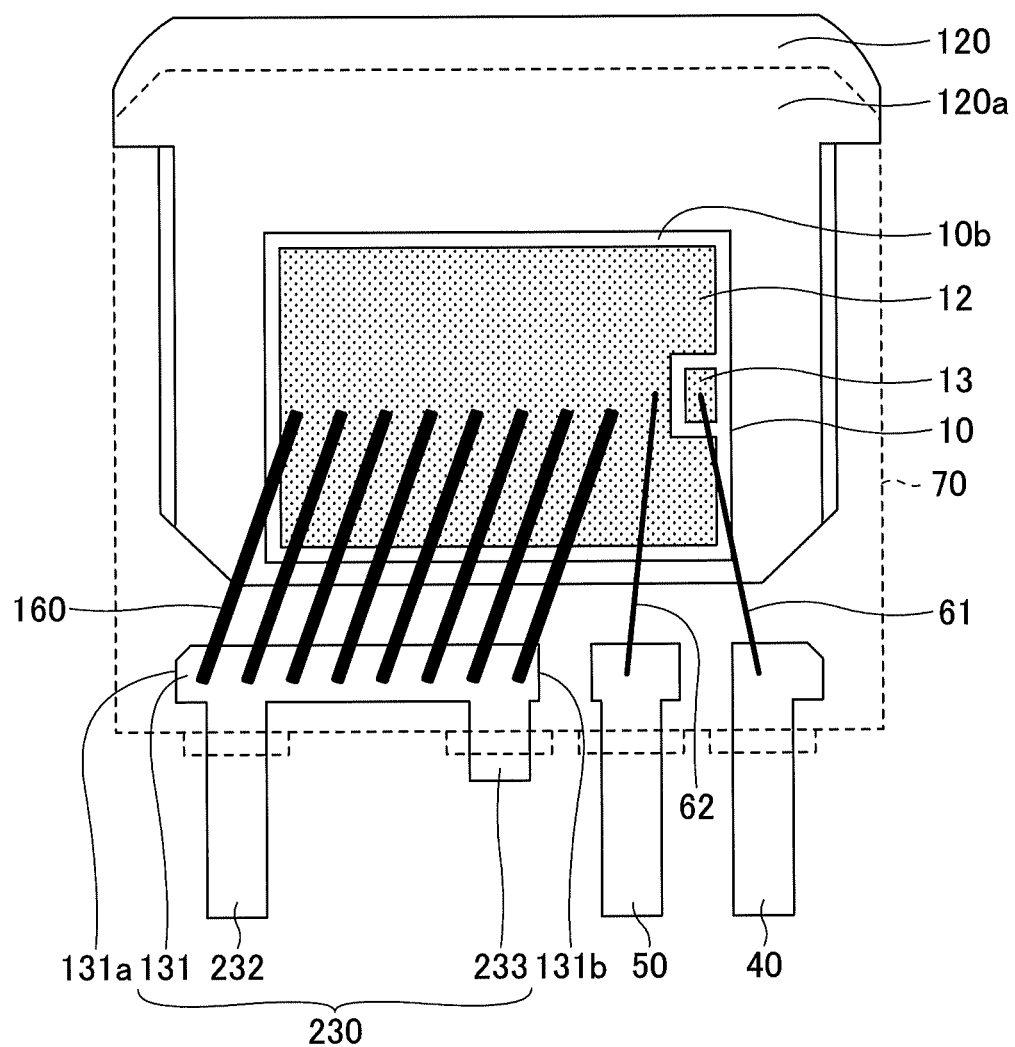
FIG. 13 is an illustrative drawing of a semiconductor apparatus according to a second embodiment of the present disclosures.
Figure 14:
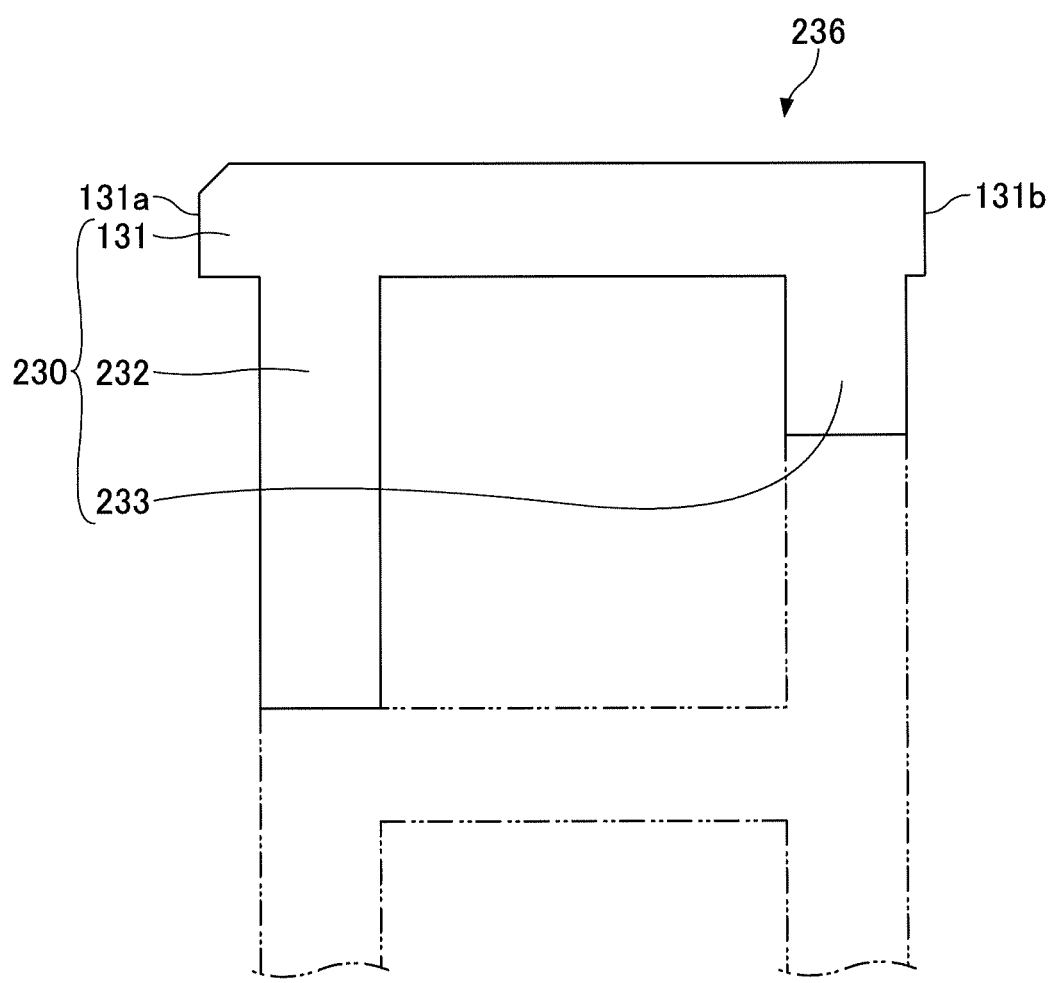
FIG. 14 is an illustrative drawing of a source electrode terminal of the semiconductor apparatus according to the second embodiment of the present disclosures.

In the following, a second embodiment will be described. The semiconductor apparatus of the present embodiment has two leads provided on the source electrode terminal, and the lengths of these leads differ from each other. Specifically, as illustrated in FIG. 13, a source electrode terminal 230 includes a wire post 131, a first lead 232 extending from one end 131a of the wire post 131, and a second lead 233 extending from the other end 131b. The length of the first lead 232 is set longer than the length of the second lead 233. It may be noted that, in FIG. 13, the mold resin 70 is illustrated in dashed lines for the sake of convenience. In the semiconductor apparatus of the present embodiment, a lead frame 236 is used to make the source electrode terminal 230 as illustrated in FIG. 14. In FIG. 14, the portion of lead frame 236 illustrated in double-dot-dash lines is cut off after performing wire bonding and hardening the mold resin 70.

Other aspects than those described above are the same as or similar to those of the first embodiment.

Although one or more embodiments have heretofore been described, any particular embodiments are non-limiting, and various variations and modifications may be made without departing from the scopes defined by the claims.

DESCRIPTION OF REFERENCE SYMBOLS 10 semiconductor chip
10a first surface
10b second surface
11 drain electrode pad
12 source electrode pad
13 gate electrode pad
20 drain electrode terminal
20a first surface
20b second surface
30 source electrode terminal
40 gate electrode terminal
50 source sense terminal
60, 61, 62 bonding wire
70 mold resin
120 drain electrode terminal
120a first surface
120b second surface
121 protrusion
130 source electrode terminal
131 wire post
131a one end
131b other end
132 first lead
133 second lead
134 third lead
160 bonding wire

The invention claimed is:

1. A semiconductor apparatus, comprising:
a semiconductor device having a drain electrode pad formed on a first surface thereof, and having a source electrode pad and a gate electrode pad formed on a second surface thereof opposite the first surface,
a drain electrode terminal supporting the semiconductor device at the first surface, and connected directly to the drain electrode pad,
a source electrode terminal connected to the source electrode pad of the semiconductor device, and
a gate electrode terminal connected to the gate electrode pad of the semiconductor device,
wherein the source electrode terminal includes a wire post, a first lead extending from one end of the wire post, and a second lead extending from another end of the wire post,
wherein the source electrode pad of the semiconductor device and the wire post of the source electrode terminal are connected to each other through a plurality of bonding wires,
wherein the semiconductor device, a surface, supporting the semiconductor device thereon, of the drain electrode terminal, the wire post of the source electrode terminal, the bonding wires, and part of the gate electrode terminal are covered with a mold resin, and
wherein the drain electrode terminal is disposed on a different side from where the source electrode terminal and the gate electrode terminal are disposed.

2. The semiconductor device as claimed in claim 1, wherein the drain electrode terminal is disposed on an opposite side from where the source electrode terminal and the gate electrode terminal are disposed.

3. The semiconductor apparatus as claimed in claim 1, wherein the wire post has no holes.

4. The semiconductor apparatus as claimed in claim 1, further comprising a source sense terminal connected to the source electrode pad of the semiconductor device.

5. The semiconductor apparatus as claimed in claim 1, wherein a length L of the wire post of the source electrode terminal in a longitudinal direction thereof and a width W of the semiconductor device in the longitudinal direction are such that $40\% \leq L/W \leq 90\%$.

6. The semiconductor apparatus as claimed in claim 1, wherein a number of the plurality of bonding wires connecting the source electrode pad of the semiconductor device and the wire post of the source electrode terminal is greater than or equal to 5 and less than or equal to 20.

7. The semiconductor apparatus as claimed in claim 1, wherein a protrusion is provided on a lateral face of the drain electrode terminal to extend from the lateral face of the drain electrode terminal, and
wherein the protrusion is situated on a same side of the lateral face of the drain electrode terminal as a surface, supporting the semiconductor device thereon, of the drain electrode terminal.

8. The semiconductor apparatus as claimed in claim 1, wherein a protrusion is provided on a lateral face of the wire post to extend from the lateral face of the wire post, and
wherein the protrusion is situated on an opposite side of the lateral face from a surface connected to the plurality of bonding wires.

9. The semiconductor apparatus as claimed in claim 1, wherein the semiconductor device is made of a material containing SiC.

10. A semiconductor apparatus, comprising:
a semiconductor device having a drain electrode pad formed on a first surface thereof, and having a source electrode pad and a gate electrode pad formed on a second surface thereof opposite the first surface,
a drain electrode terminal supporting the semiconductor device at the first surface, and connected directly to the drain electrode pad,
a source electrode terminal connected to the source electrode pad of the semiconductor device, and
a gate electrode terminal connected to the gate electrode pad of the semiconductor device,
wherein the source electrode terminal includes a wire post, a first lead extending from one end of the wire post, and a second lead extending from another end of the wire post,
wherein the source electrode pad of the semiconductor device and the wire post of the source electrode terminal are connected to each other through a plurality of bonding wires,
wherein the semiconductor device, a surface, supporting the semiconductor device thereon, of the drain electrode terminal, the wire post of the source electrode terminal, the bonding wires, and part of the gate electrode terminal are covered with a mold resin,
wherein the drain electrode terminal is disposed on an opposite side from where the source electrode terminal and the gate electrode terminal are disposed,
wherein a protrusion is provided on a lateral face of the drain electrode terminal to extend from the lateral face of the drain electrode terminal,
wherein the protrusion is situated on a same side of the lateral face of the drain electrode terminal as a surface, supporting the semiconductor device thereon, of the drain electrode terminal,
wherein a protrusion is provided on a lateral face of the wire post to extend from the lateral face of the wire post, and
wherein the protrusion is situated on an opposite side of the lateral face from a surface connected to the bonding wires.

11. A semiconductor apparatus, comprising:
a semiconductor device having a drain electrode pad formed on a first surface thereof, and having a source electrode pad and a gate electrode pad formed on a second surface thereof opposite the first surface,
a drain electrode terminal supporting the semiconductor device at the first surface, and connected directly to the drain electrode pad,
a source electrode terminal connected to the source electrode pad of the semiconductor device, and
a gate electrode terminal connected to the gate electrode pad of the semiconductor device,
wherein the source electrode terminal includes a wire post, a first lead extending from one end of the wire post, and a second lead extending from another end of the wire post,
wherein the source electrode pad of the semiconductor device and the wire post of the source electrode terminal are connected to each other through a plurality of bonding wires,
wherein the semiconductor device, a surface, supporting the semiconductor device thereon, of the drain electrode terminal, the wire post of the source electrode terminal, the bonding wires, and part of the gate electrode terminal are covered with a mold resin,
wherein a protrusion is provided on a lateral face of the wire post to extend from the lateral face of the wire post, and
wherein the protrusion is situated on an opposite side of the lateral face from a surface connected to the plurality of bonding wires.

12. The semiconductor device as claimed in claim 11, wherein the drain electrode terminal is disposed on an opposite side from where the source electrode terminal and the gate electrode terminal are disposed.

13. The semiconductor apparatus as claimed in claim 11, wherein the wire post has no holes.

14. The semiconductor apparatus as claimed in claim 11, further comprising a source sense terminal connected to the source electrode pad of the semiconductor device.

15. The semiconductor apparatus as claimed in claim 11, wherein a length L of the wire post of the source electrode terminal in a longitudinal direction thereof and a width W of the semiconductor device in the longitudinal direction are such that $40\% \leq L/W \leq 90\%$.

16. The semiconductor apparatus as claimed in claim 11, wherein a number of the plurality of bonding wires connecting the source electrode pad of the semiconductor device and the wire post of the source electrode terminal is greater than or equal to 5 and less than or equal to 20.

17. The semiconductor apparatus as claimed in claim 11, wherein a protrusion is provided on a lateral face of the drain electrode terminal to extend from the lateral face of the drain electrode terminal, and
wherein the protrusion is situated on a same side of the lateral face of the drain electrode terminal as a surface, supporting the semiconductor device thereon, of the drain electrode terminal.

18. The semiconductor apparatus as claimed in claim 11, wherein a protrusion is provided on a lateral face of the wire post to extend from the lateral face of the wire post, and
wherein the protrusion is situated on an opposite side of the lateral face from a surface connected to the plurality of bonding wires.

19. The semiconductor apparatus as claimed in claim 11, wherein the semiconductor device is made of a material containing SiC.

* * * * *